(12) United States Patent
Siebert et al.

(10) Patent No.: US 7,284,760 B2
(45) Date of Patent: Oct. 23, 2007

(54) HOLDING DEVICE FOR DISK-SHAPED OBJECTS

(75) Inventors: Sönke Siebert, Mainz (DE); Michael Schweiger, Ostermünde (DE); Andreas Lang, Frankfurt (DE)

(73) Assignee: Nanophotonics AG (DE)

( * ) Notice: Subject to any disclaimer, the term of this patent is extended or adjusted under 35 U.S.C. 154(b) by 218 days.

(21) Appl. No.: 10/913,891

(22) Filed: Aug. 6, 2004

(65) Prior Publication Data
US 2005/0031497 A1   Feb. 10, 2005

(30) Foreign Application Priority Data
Aug. 7, 2003   (DE) .................. 103 36 205

(51) Int. Cl.
  B23B 31/30   (2006.01)
(52) U.S. Cl. .................. 279/4.12; 279/106; 279/119; 279/120; 279/141; 118/500; 118/730
(58) Field of Classification Search ............. 279/4.12, 279/106, 119, 120, 141, 4.1, 4.11, 35, 108, 279/109, 118; 118/500, 730; 269/21
See application file for complete search history.

(56) References Cited

U.S. PATENT DOCUMENTS

| | | | |
|---|---|---|---|
| 4,788,994 A * | 12/1988 | Shinbara ..................... | 134/157 |
| 5,040,484 A * | 8/1991 | Mears et al. ................. | 118/503 |
| 5,376,216 A * | 12/1994 | Yoshioka et al. ......... | 156/345.55 |
| 5,421,056 A * | 6/1995 | Tateyama et al. ............. | 15/302 |
| 5,775,000 A | 7/1998 | Maekawa et al. | |
| 5,851,041 A * | 12/1998 | Anderson et al. ........... | 294/106 |
| 5,954,072 A | 9/1999 | Matusita | |
| 5,989,342 A * | 11/1999 | Ikeda et al. .................... | 118/52 |
| 6,167,893 B1 | 1/2001 | Taatjes et al. | |
| 6,217,034 B1 | 4/2001 | Smedt et al. | |
| 6,267,853 B1 * | 7/2001 | Dordi et al. ................. | 204/232 |
| 6,273,484 B1 | 8/2001 | Peng | |
| 6,363,623 B1 | 4/2002 | Abraham | |
| 6,537,416 B1 | 3/2003 | Mayer et al. | |
| 6,578,853 B1 | 6/2003 | Treur et al. | |
| 6,689,257 B2 * | 2/2004 | Mishima et al. ......... | 204/224 R |
| 6,752,442 B2 * | 6/2004 | McNurlin et al. .......... | 294/106 |
| 6,761,362 B2 * | 7/2004 | Noguchi ..................... | 279/106 |
| 6,824,343 B2 * | 11/2004 | Kurita et al. ................ | 414/217 |
| 6,827,092 B1 * | 12/2004 | Smith et al. ................. | 134/149 |

(Continued)

FOREIGN PATENT DOCUMENTS

JP   04188626   7/1992

*Primary Examiner*—Monica Carter
*Assistant Examiner*—Michael W. Talbot
(74) *Attorney, Agent, or Firm*—Hudak, Shunk & Farine Co. LPA

(57) ABSTRACT

Semiconductor technology requires the use of object holders, which are capable of holding wafers securely, also during rotation. In order to save time and expense, such holders should be suitable for integration directly into a processing facility, wherever possible. According to the invention it is proposed to provide centrally mounted holders which comprise support surfaces for the wafer and pivotable gripper fingers, in which the gripper fingers are pretensioned by means of at least one pretension element in the holding position and are actuated through one opening mechanism, in which at least one opening mechanism and at least one pretension element are integrated in the central clamping arm fixture and/or in the clamping arms.

19 Claims, 11 Drawing Sheets

U.S. PATENT DOCUMENTS 6,848,194 B2 * 2/2005 Treur ........................... 34/58
6,935,638 B2 * 8/2005 Ivanov et al. ............... 279/106
2002/0014142 A1 2/2002 Ward et al.
2003/0110658 A1 6/2003 Treur

* cited by examiner

HOLDING DEVICE FOR DISK-SHAPED OBJECTS

FIELD OF THE INVENTION

The invention relates to a holding device for disk-shaped objects, specifically wafers, with at least two centrally mounted clamping arms, which comprise support surfaces for the object and pivotable gripper fingers, in which the gripper fingers are pivotable from a clamping position into an opening position and vice versa, each of which are pretensioned in their clamping position with a pretension element and actuated by means of at least one opening mechanism.

BACKGROUND OF THE INVENTION

Generic object holders are, for instance, required in semiconductor technology. During the manufacture of semiconductor components, such as computer chips, wafers are coated several times and are chemically treated. In order to distribute reagents homogenously over the wafer or dry the wafer between two processing steps, the wafer is frequently rotated on its own axis. The wafer is frequently also rotated for quality control purposes when optical measuring methods are used. The holders which are employed must ensure that the wafer is also securely held during rotation, especially at high rotational speeds (normally 1200 rpm).

U.S. Pat. No. 6,167,893 B1, describes a dynamic chuck for semiconductor wafers. It comprises three clamping arms with supports for the wafer as well as pivotable grippers on the outside ends of the clamping arms. The pivotable grippers incorporate centrifugal weights. During the rotation of the chuck with the wafer, the centrifugal force pulls the centrifugal weights to the outside, causing the gripper fingers to pivot against the wafer edge and thus holding the wafer.

U.S. Pat. No. 6,363,623 B1 describes a device for rotating an object, e.g. a wafer. Work piece supports with resilient bumpers are symmetrically positioned on a rotatable platform. These resilient bumpers serve as support for the wafer and increase the friction between the wafer and the platform in order to reduce slippage, especially during the rotation. In addition, the device comprises gripper assemblies that are configured to center the wafer on the rotatable platform. The gripper assemblies are provided with pivotable fingers, which incorporate centrifugal weights, pivoting them against the wafer during rotation, due to the centrifugal force, thereby firmly securing it.

The wafer holding device described in U.S. Pat. No. 6,273,484 B1 also comprises a plurality of pivotable jaws with centrifugal weights. In addition, these jaws comprise a step portion for supporting the wafer during standstill. During rotation, the jaws pivot in such a manner that they hold down the wafer. When the wafer holding device comes to a stop after the rotation, the pivotable jaws are returned into their home position by means of springs.

The rotary processing apparatus for substrates described in U.S. Pat. No. 5,954,072 comprises pivotable grippers around the periphery of the plate-like substrate holder, which are pushed against the substrate, e.g. by means of springs, during standstill or at low rotation speeds. The additional pivoting action that results from the centrifugal forces during rotation holds down the substrate.

In the edge handling wafer, as described in U.S. Pat. No. 6,217,034, the wafer is carried along by spring-loaded clamping elements.

An air cushion between the wafer and the rotating table improves the axial runout of the clamped wafer, so that this device is also suitable for wafer inspection by optical measuring methods.

U.S. Pat. No. 5,775,000 describes a substrate gripper device for spin dryers comprising clamping arms with horizontal substrate supports with a plurality of pivotably mounted gripper fingers. Springs between the finger and the respective clamping arm ensure that the gripper fingers are pretensioned and hold the substrate on the substrate support. In order to open the holding device, the fingers are pivoted away from the substrate against the spring action by means of pins. In order to actuate the pins, a mechanism made up from an inner and an outer sleeve is provided, arranged around the rotational axis of the gripper. At the bottom end, the inner shaft is developed as a piston and the outer shaft as a cylinder. Both sleeves are moved against each other by means of a working fluid. During the movement of the two sleeves against each other, a cup-shaped element is moved in the direction of the opening pins. A cup shape with a rotatable substrate is necessary, because the entire mechanism does not rotate concurrently during the rotation of the clamping arms with the substrate. The pins, however, are attached to the clamping arm and also perform the rotation.

U.S. Pat. No. 6,537,416 B1 describes a wafer chuck with three centrally mounted clamping arms, which comprise support surfaces for the wafer and the connector pins. The connector pins also serve to align the wafer on the support surfaces, requiring the connector pins to be shifted in a radial direction. For this purpose, a pneumatic actuator is provided, which shifts a slide on the connector pin, which is pretensioned with a spring, from its holding position into the opening position. This opening mechanism is located outside of the clamping arms. This wafer chuck, can, for instance, not be positioned overhead, because the wafer would not be securely retained in all positions.

U.S. Pat. No. 2003/0110658 A1 describes a wafer holder comprising a circular body which comprises a multitude of spokes on its bottom side, each of which provide an actuating mechanism for the gripper finger arranged on the radial end. Since no support surface for the wafer is provided, the gripper fingers are designed so that they encompass the edge of the wafer. This holding device has the disadvantage in that the wafer must be fed from the top and be held in its position until the gripper fingers have grasped the wafer.

SUMMARY OF THE INVENTION

The object of the present invention is to provide a holding device which on the one hand ensures a secure hold of the object both during standstill as well as during rotation and on the other is designed as space efficient as possible, so that it can be integrated into any production facilities easily.

This problem is solved by means of a holding device for disk-shaped objects, specifically wafers, which has at least two centrally mounted clamping arms which comprise support surfaces for the object and pivotable gripper fingers, in which the gripper fingers are pretensioned by means of at least one pretension element in the holding position and are actuated by means of at least one opening mechanism, in which at least one opening mechanism and at least one pretension element are integrated in the central clamping arm fixture and/or the clamping arms.

The integration of at least one pretension element and of at least one opening mechanism in the central clamping arm fixture and/or the clamping arms offers several advantages.

On the one hand, the required space and the volume of external opening mechanisms and retention elements are reduced. On the other hand, the opening mechanism(s) and the pretension element(s) also rotate concurrently with the clamping arms, so that additional elements such as the cup-shaped element with the rotatable substrate according to U.S. Pat. No. 5,775,000 are not necessary.

By keeping the number of moving components in close vicinity to the object as small as possible in the holding device according to the invention, it also keeps the risk of particle attrition as low as possible. This is especially significant when using the holding device according to the invention for the manufacture of semiconductor components.

The compact design of the holding device according to the invention enables it to also be used in miniaturized equipment, especially for optical inspection of the objects to be held. There is an increasing demand for measuring technology that can be directly integrated into processing facilities, for instance, for 300 mm wafer technology. As a result, time-consuming and costly steps can be avoided in having to measure the wafer externally. Measuring equipment can particularly be integrated into wafer containers (Front Opening Unified Pot FOUP) with the holder according to the invention.

The minimum number of clamping arms is determined by the shape of the object to be held. For rectangular objects, two clamping arms may be sufficient in order to ensure a secure hold, both at standstill, as well as during rotation. For disks that are essentially circular, such as wafers, the use of at least three clamping arms is recommended.

A decisive factor in the design of the pretension elements is whether each gripper fingers is pretensioned separately, in which case the pretension element should expediently be integrated in the clamping arm, or whether the gripper fingers are centrally pretensioned together, in which case the pretension element would be located in the central clamping arm fixture and the pretension force of the pretension element would be transferred to the individual gripper fingers by means of additional components. Such transfer components would then be integrated in the clamping arms. These transfer components could also be used, if a central opening mechanism in the central clamping arm fixture is provided.

By holding the object in position by means of pretension elements, omni-directional applications can be performed.

The opening mechanisms, pretension elements and/or transfer components, if applicable, which are coupled to the gripper fingers, act as centrifugal weights on the gripper fingers during rotation. As a result of the centrifugal forces during the rotation, the pressure that each gripper finger exerts on the object is increased and clamping force is amplified, which results in additional secure positioning of the object during rotation.

In one preferred embodiment, the opening mechanism(s) is/are magnetically operated. This requires the use of a magneto inductor, which is surrounded by a magnetizing coil, to which current is supplied, in order to open the gripper finger(s). Here, the magnet inductor also serves as a centrifugal force weight. In the holding position, the gripper finger(s) is/are supported by a pretension element.

In another preferred embodiment, the opening mechanism (s) is/are operated with compressed air. In one air-operated opening mechanism, the respective gripper finger is either supported in the holding position by means of a pretension element and is then pivoted away from the object to be held by supplying compressed air, or the respective gripper finger is pretensioned and held in the holding position by an air-operated pressure cylinder, while the compressed air supply is shut off for opening the gripper fingers.

In one particularly preferred embodiment, the gripper fingers are actuated with vacuum. The clamping force in the holding position is supplied by pretension elements, such as compression springs. Vacuum is applied briefly to the vacuum cylinders only to open the gripper fingers, e.g. in order to compress the compression springs. The vacuum components integrated in the clamping arm act as a centrifugal weight for the gripper finger, in order to ensure extra secure positioning of the object to be clamped during rotation. The vacuum-operated embodiment comprises additional advantages in that on the one hand, the components which perform relative movements to one another, such as state-of-the-art friction springs or opening mechanisms, can be installed in the encapsulated area on the vacuum side of the vacuum components. This achieves an extremely compact physical size, however. Furthermore, the probability for undesired particle contamination of the object to be held is thereby significantly reduced. Any particles that are generated while the opening mechanism is in operation, are exhausted by the vacuum to the inside.

The gripper fingers are preferably pivoted in such a manner that they grasp the object perpendicular in relation to the disk surface in the holding position. The edge of the object is thus clamped and held between the gripper fingers and the support surface, which enables the holding device to be installed in any position, e.g. even overhead. This method also ensures that no forces are introduced into the disk, that could produce distortion of the disk-shaped object. The holding device is therefore also very suitable for use in measuring equipment for inspecting the object surface by means of optical measuring methods.

The gripper finger preferably comprises a first and a second leg, where the first leg incorporates a locating face for grasping the object. The legs are preferably arranged at right angles to one another. The gripper finger is preferably designed in the form of an L-shape, where the locating face is preferably positioned on the shorter leg.

According to a first embodiment, the supporting surface faces away from the clamping arm and the pivot axis is preferably arranged within the junction area of both legs. As a result, the free end of the first leg, which has the locating surface, performs an orbit.

The pivot axes are preferably located in the plane formed by the supporting surfaces. The supporting surface intersects the orbit of the locating face at right angles, so that the gripper finger presses perpendicular against the disk-shaped object. If the holding device is installed in such a way that the clamping arms are arranged below the wafer (the so-called normal position), each of the gripper fingers essentially exerts pressure from the top on the object in the holding position.

The gripper fingers are preferably arranged at the very end of the clamping arms by means of the pivot axes.

The opening mechanism comprises preferably at least one movable push rod alongside the clamping arm, which is connected to a swivel joint.

The swivel joint is preferably a connecting element, which is hinged to the free end of the second leg of the gripper finger.

In a further embodiment, the position of the supporting surface and the locating surface is swapped. In the normal position, the gripper finger would press against the object from below. This embodiment is preferred for use with the so-called overhead mounting position, so that the clamping arms are arranged above the wafer. This overhead position is advantageous, if the system into which the holding, device is to be installed has no provision for turning over the wafer.

The stationary supporting surfaces are located on the clamping arms and are preferably designed as hook-shaped elements in this embodiment. According to this embodiment, the supporting surfaces are facing toward the clamping arm, and the pivot axis is arranged in the second leg. The first leg, which is preferably mounted perpendicular in relation to the second leg, is thus arranged tangentially in relation to the orbit of the gripper finger, so that this locating surface almost pushes perpendicular against the disk-shaped object.

The pivot axis is preferably arranged in the area between the leg center and the inside end of the second leg. The larger the path radius selected, the smaller the component forces that are exerted by the first leg which is located in the disk plane.

The section of the second leg between the pivot axis and the first leg is preferably of a resilient design. The locating surface can thus contact the disk-shaped object softly and carefully.

The first leg is preferably a peg with a beveled locating face. The locating face does not touch the disk plane, but preferably the bevel of the edge of the disk-shaped object.

A shielding disk is preferably located between the wafer and the clamping arms to prevent particles e.g. attrition particles or similar contaminants from getting onto the disk-shaped object.

During the rotation of the holding device, a radial airflow between the wafer and the shielding disk is generated, which results in the distortion of the object because of the ensuing vacuum. This increases the potential for sagging of the disk-shaped object when the holding device is in its normal position. For this reason, the diameter of the shielding disk should be smaller than the diameter of the object. The radial airflow to the outside can thereby prematurely stream off in an axial direction and/or enable air to flow back on the edge of the disk, which will reduce the vacuum and also reduce any additional distortion of the object or even prevent it altogether.

In the overhead position, any sagging of the object is compensated for by the airflow and the ensuing vacuum.

It has further proven advantageous to adjust the amount of clamping force in a manner that produces a frictional force which is larger than the centrifugal force when multiplied with the friction coefficient between the object and the object support, because of the maximum attainable object imbalance.

In order to prevent particles from reaching the object, the opening mechanism and/or at least one pretension element, with all associated components, if necessary, are preferably completely encapsulated in the clamping arm and/or in the central clamping arm fixture. In addition, any particles can be extracted, if necessary, which is preferably performed e.g. by means of hollow push rods.

BRIEF DESCRIPTION OF THE DRAWINGS

The following figures provide greater detail of the invention, as follows.

DETAILED DESCRIPTION OF THE INVENTION

Figure 1:
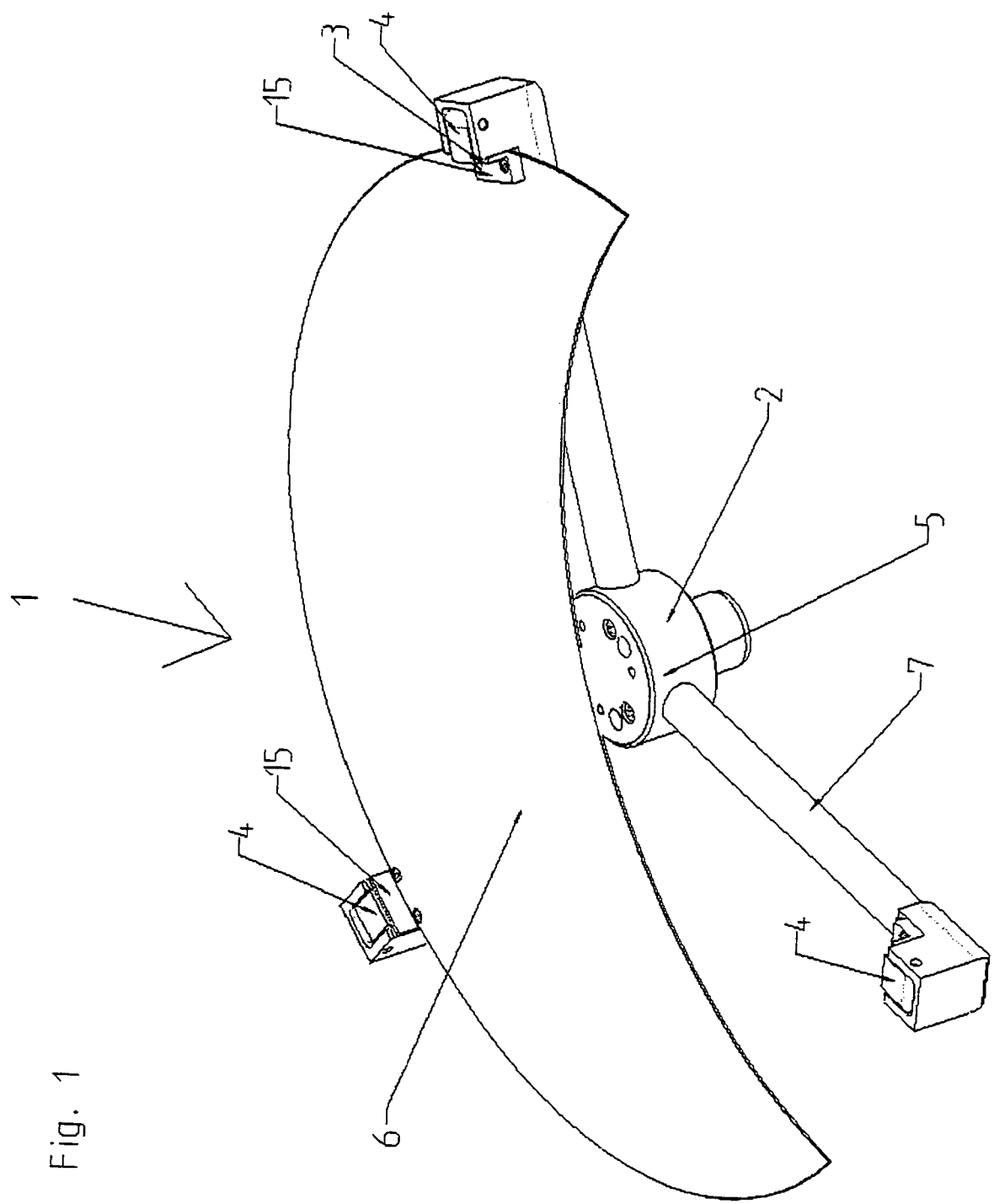
FIG. 1 general view of a holding device according to the invention.

FIG. 1 shows a holding device 1 for wafers. The holding device 1 comprises three clamping arms 7. The clamping arms 7 are radially arranged on a central clamping arm fixture 2 toward the outside. In addition, the central clamping arm fixture 2 incorporates a vacuum feed-thru 5 for actuating the vacuum-powered opening mechanisms 100 that are incorporated in each clamping arm 7. Support elements 15 with a support surface 3 for the wafer (not shown) as well as swivel-mounted gripper fingers 4 are grouped on the outer ends of the clamping arms 7. The support surfaces 3 also serve for pre-centering the wafer when it is placed onto the holding device 1. The support element 15 as well as the gripper finger 4 are shown with dotted lines. A shielding disk 6 is also shown. This shielding disk 6 between the clamping arms 7 and the wafer is provided to protect the wafer against potential particles.

Figure 2:
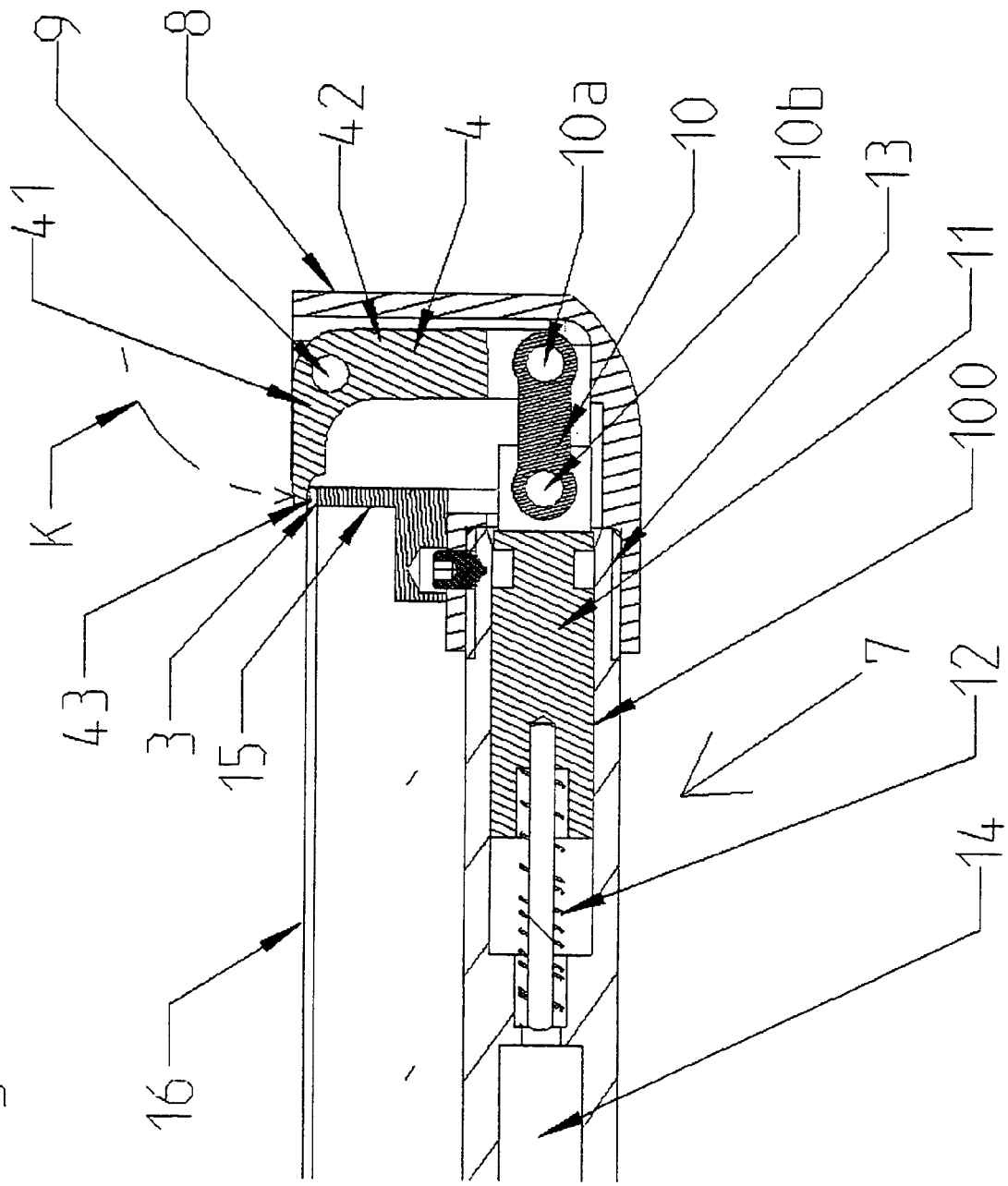
FIG. 2 a vacuum-powered opening mechanism.

FIG. 2 shows the assembly of a vacuum-powered opening mechanism 100. The wafer 16 rests on the support surface 3 of the support element 15. There, the wafer 16 is held from the top by the gripper finger 4. The gripper finger 4 is L-shaped and has a first or short leg 41 and a second or long leg 42. A locating face 43 is provided on the front end of the first leg. In the holding position shown here, the edge of the wafer is clamped between the support surface 3 and the locating face 43.

Figure 3:
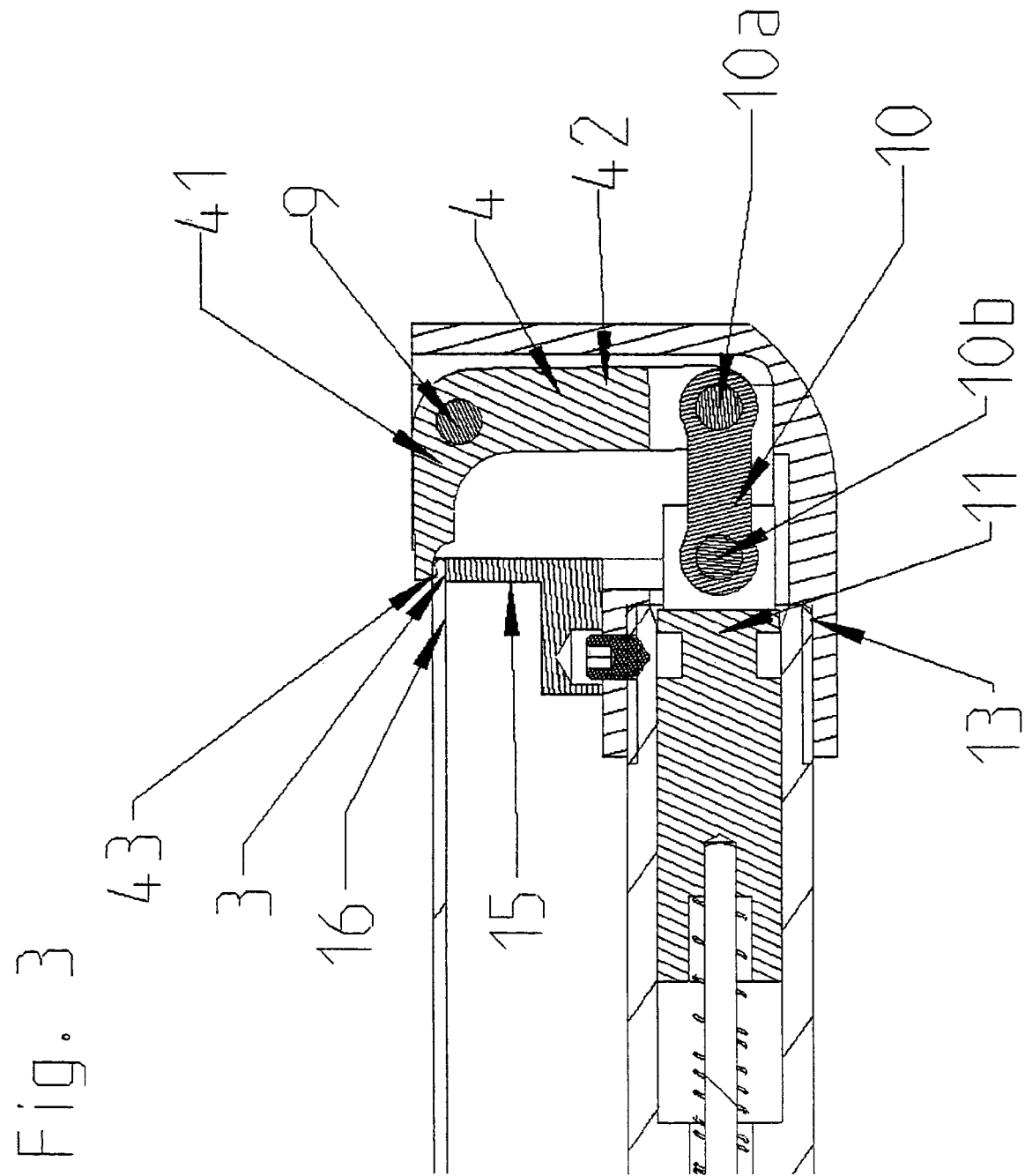
FIG. 3 a gripper finger.

The pivot axis 9 of gripper finger 4 is positioned parallel relative to the plane of the wafer 16 and is located in the junction area of both legs 41 and 42, whereas the pivot axis 9 is positioned almost within the plane which is clamped by the support surfaces 3. As a result, the locating face 43 performs an orbit K, while the locating face 43 presses perpendicular against the surface of the wafer 16. No radial acting forces occur. This is more accurately depicted in FIG. 3.

The holding force is adjusted to produce a frictional force when multiplied with the friction coefficient between the wafer 16 and the gripper finger 4, which is larger than the centrifugal force when divided by the maximum attainable wafer imbalance. This improves the thrust accuracy of the wafer 16 on the holding device 1.

Using a connecting element 10, which is hinged to the end of the second leg 42 in pivot point 10*a*, the gripper finger 4 is connected with the vacuum-powered push rod in form of a radial piston 11 in pivot point 10*b*. The radial piston 11 is integrated in the clamping arm 7. The radial end of clamping arm 7 is developed as a bush 13 for the radial piston 11.

The gripper finger 4 is pretensioned, i.e. it is held in its holding position, by a compression spring 12.

If the gripper finger 4 is to be opened, vacuum is applied to the radial piston 11 through the vacuum feed in clamping arm 7, moving it to the inside, and it then swivels the gripper finger 4 away from wafer 16 by means of the connecting element 10 around pivot axis 9. When gripper finger 4 is closed, it is pushed into its holding position again with the aid of a compression spring 12.

If the holding device 1 is put into rotation, the radial piston 11 acts as a centrifugal weight for the gripper finger 4, thus pushing radially outward, so that the gripper finger 4 exerts increased downward pressure on the wafer 16 and thus holds it more securely.

By integrating the radial piston 11 into the clamping arm 7 and utilizing the radial piston 11 as a centrifugal weight, an extremely compact physical size is achieved. In addition, any parts which move relative against each other, such as the compression spring 12 and the radial piston 11, are relocated in the encapsulated area on the vacuum side of bush 13. This reduces the potential sources for particles which are generally undesirable in semiconductor manufacture and inspection. Any particles that are generated by the radial piston 11 itself during its movement in bush 13 are exhausted to the inside by the vacuum and are then removed from the central clamping arm fixture 2. Any potential particles that are generated by the drive units can be kept away from the wafer 16 with the shielding disk 6 indicated in FIG. 1.

An air-operated opening mechanism 100 is comparable to the vacuum-powered opening mechanism 100 illustrated in FIG. 2. The main difference here is that the compression spring 12 is replaced with a tension spring. In the holding position, it is compressed with radial piston 11 by a pressurized cylinder. To open, the compressed air feed is shut off, so that the tension spring swivels the gripper finger 4 away from the wafer 16 by means of a connecting element 10.

During rotation, the radial piston 11 acts as a centrifugal weight for gripper finger 4.

Figure 4:
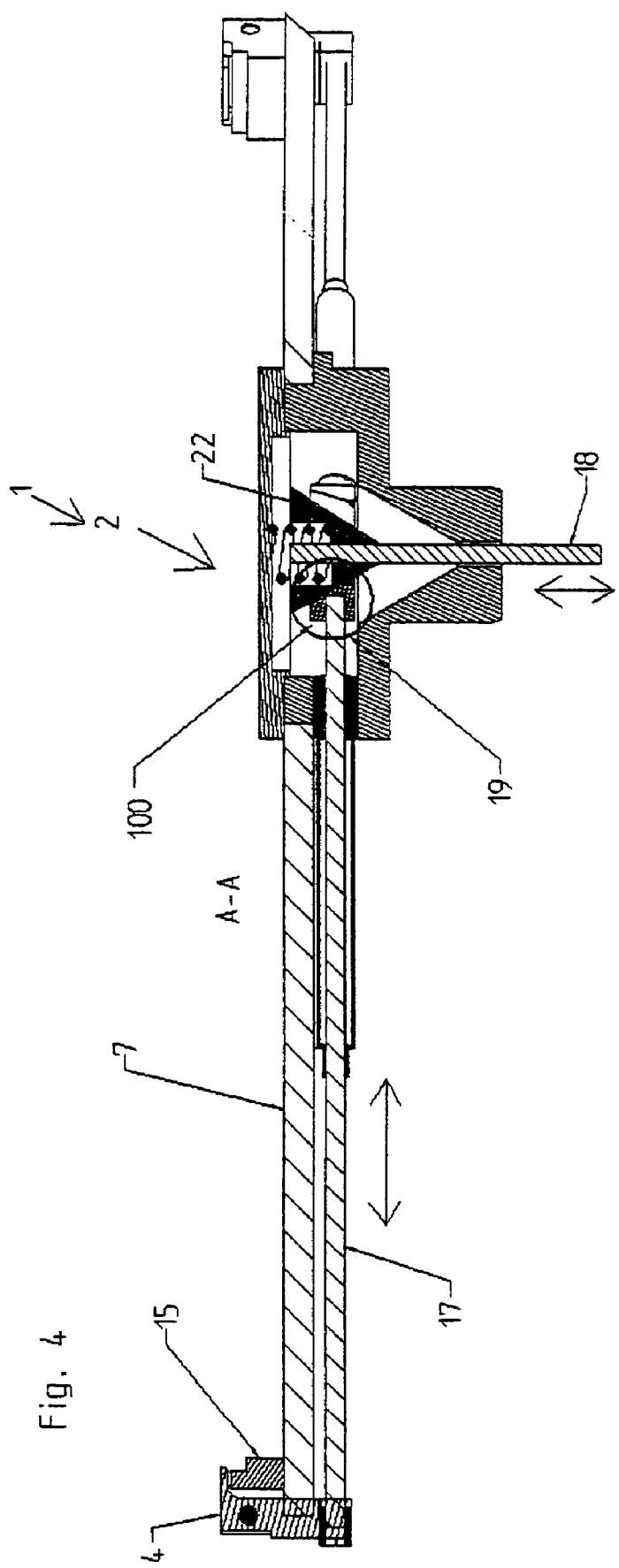
FIG. 4 a centrally arranged opening mechanism.

FIG. 4 illustrates the mode of operation of a holding device 1, in which the opening mechanism 100 and the pretension element 12 are incorporated in the central clamping arm fixture 2. The force for opening the gripper fingers 4 is generated with a single vacuum cylinder located in the center of the holding device (not shown here). The central vacuum cylinder moves the gripper fingers 4 by means of a redirecting mechanism and radial push rods 17. The redirecting mechanism essentially comprises a body 22 which is attached to compression spring 7, which has three inclined linear guides 19 (three finger vacuum grippers) which act in concert with the push rods 17. The body 22 is moved by means of a push rod 18, which can be magnetically, pneumatically, or vacuum operated. In the holding position, the body 22 is in the position shown in FIG. 4.

If the gripper fingers 4 are to be opened, the body 22 is pushed up against the force of the compression spring 12 with push rod 18, so that the push rods 17 move radially to the inside, causing the gripper fingers 4 to swing upward. During the central actuation of the gripper fingers, the push rods 17 act as centrifugal weights. The opening mechanism 100 located in the central clamping arm fixture 2 can then be attached so that it does not interact with the rotary motion.

Figure 5:
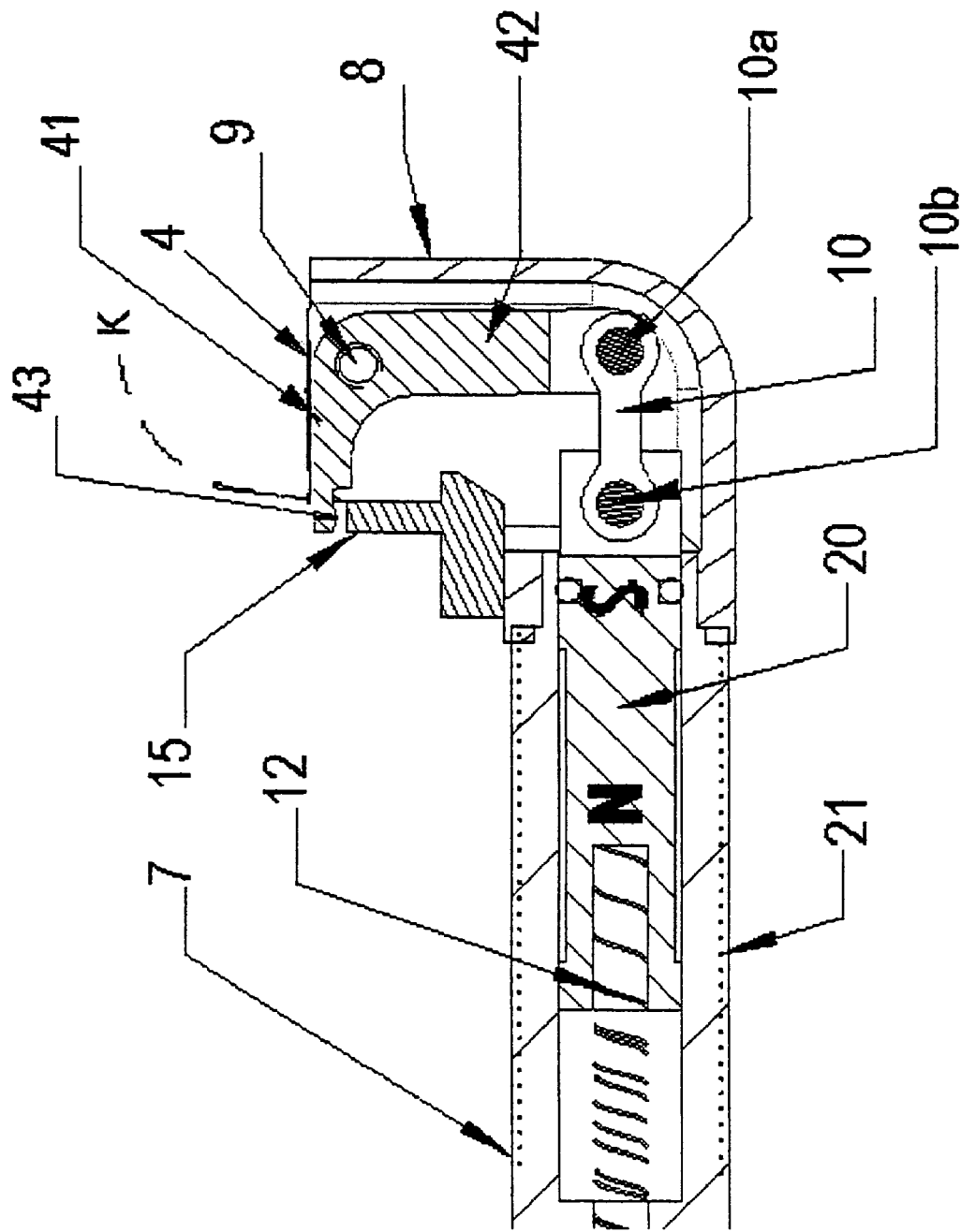
FIG. 5 a magnetic opening mechanism.

FIG. 5 shows a magnetic opening mechanism 100 which differs from the vacuum-powered opening mechanism 100 in that the radial piston is replaced by a magnet inductor 20, which is enclosed by a magnet coil 21. In the holding position, current is applied to the magnet coil 21, and the force of the compression spring 12 pushes the gripper finger 4 against the wafer by means of connecting element 10. If the gripper finger 4 is to be opened, current is applied to magnet coil 21, which pushes the magnet inductor 20 inward against the force of the compression spring 12, causing the gripper finger to swing up. In addition, the magnet inductor 20 also works as a centrifugal weight.

Figure 6:
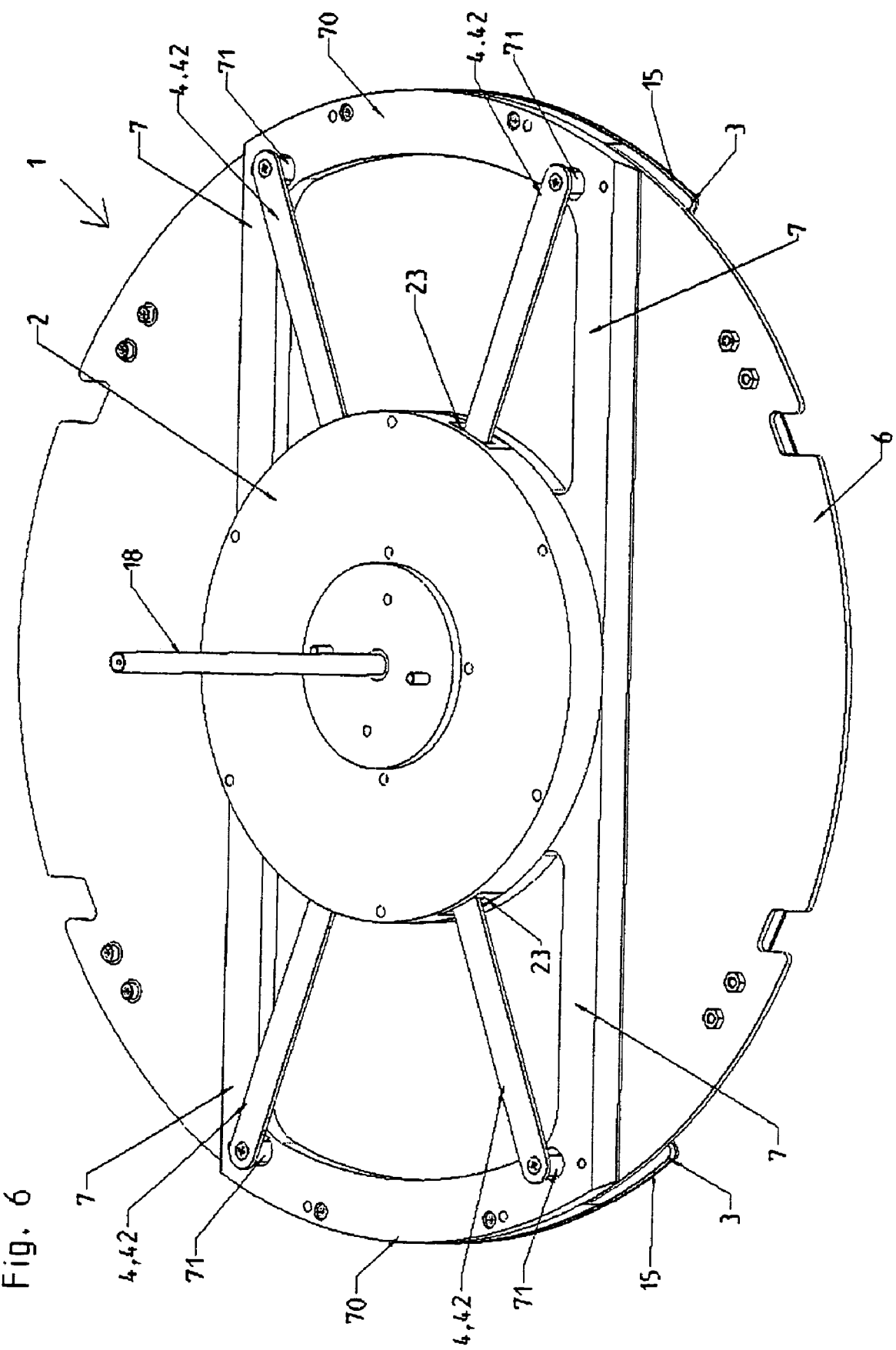
FIG. 6 a holding device according to another embodiment in the overhead position.

FIG. 6 shows a holding device 1 according to a further embodiment. The holding device 1 is shown in the overhead position, so that the push rod 18 protrudes upward from the central clamping arm fixture 2. The central clamping arm fixture 2 has a total of four clamping arms 7 which each are connected to each other on the outer end, by means of a frame element 70. The central clamping arm fixture 2 is encapsulated and comprises openings 23 on its outer perimeter, through which the gripper fingers 4 extend radially out up to the frame elements 70, which have openings 71 through which the first legs 42 of the gripper fingers 4 extend downward. The gripper fingers 4 are also L-shaped and each have a first leg 42 as well as a second leg 46, which is pivoted within the central clamping arm fixture 2, which is explained in detail in connection with the following Figures.

A shielding disk 6 is arranged on the frame element 70 and on the clamping arms 7. Below the shielding disk 6, circarc support elements 15 with support surfaces 3 are attached, in which the support surface 3 illustrated here faces up and thus toward the clamping arms 4.

Figure 7:
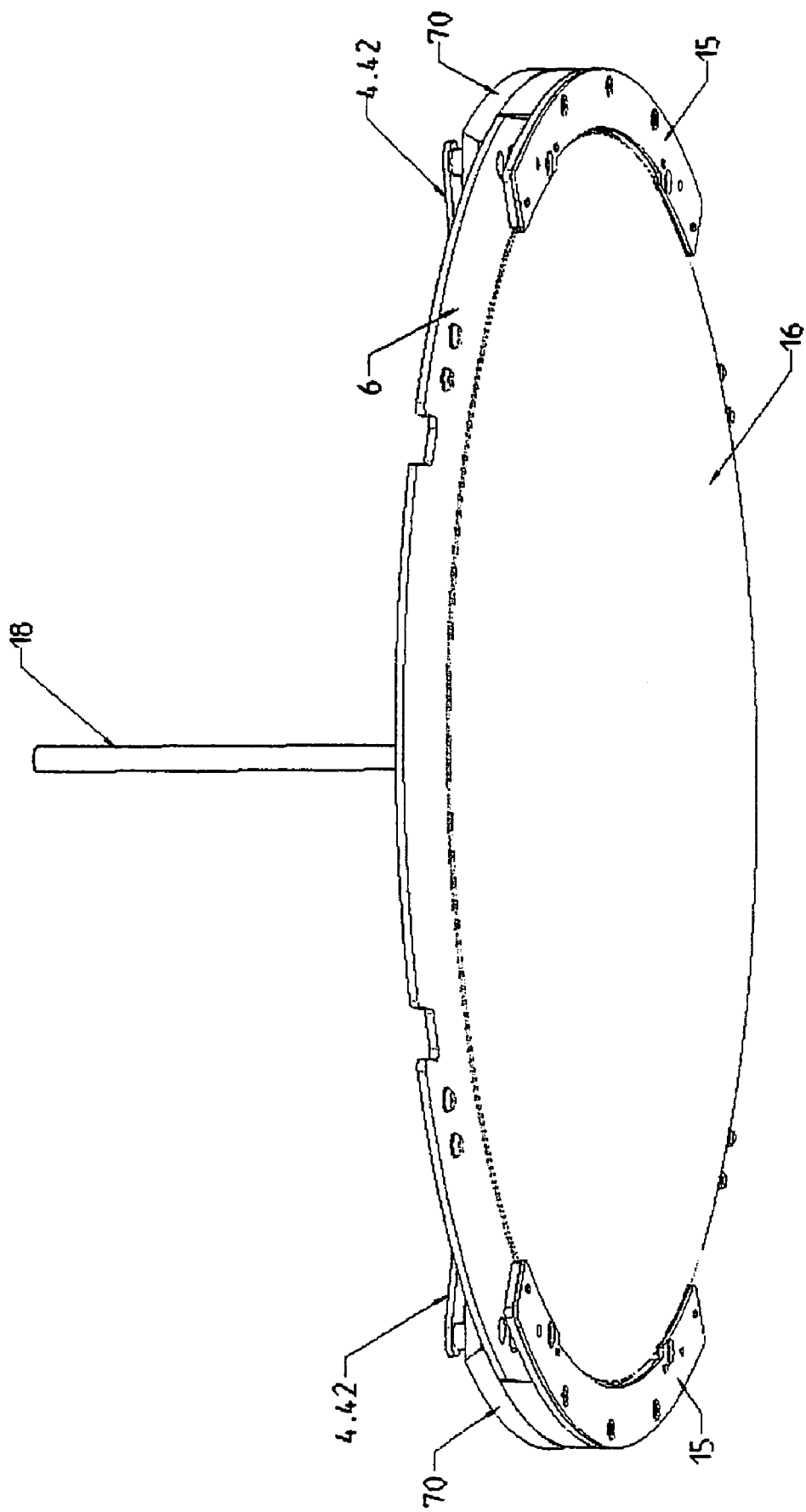
FIG. 7 exploded bottom view of the holding device shown in FIG. 6.

FIG. 7 illustrates the bottom view, where wafer 16 can also be seen resting on both circarc support elements 15.

Figure 8:
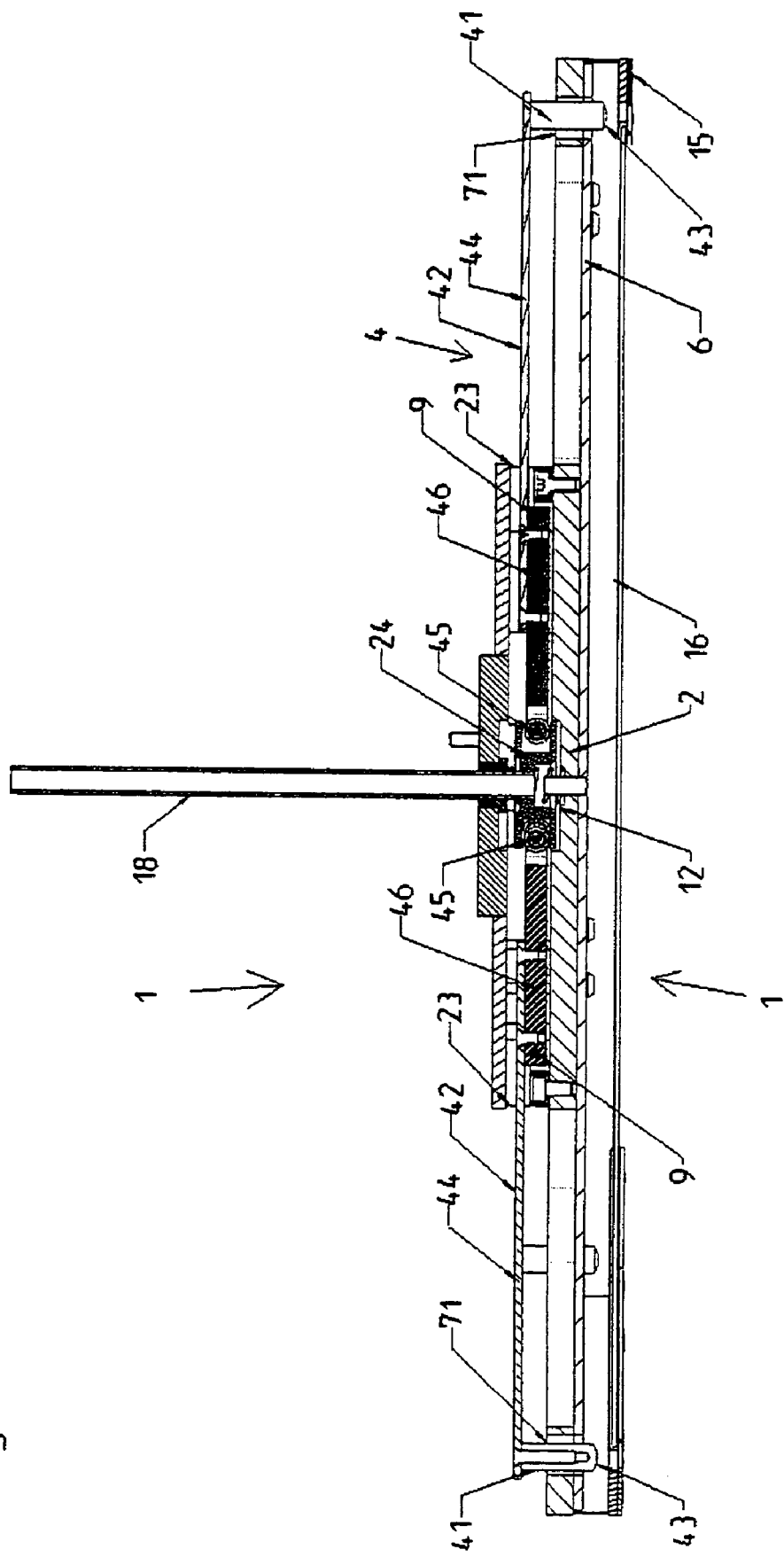
FIG. 8 a vertical section through the holding device presented in FIGS. 6 and 7 in the open position.

FIG. 8 shows a vertical section through the holding device 1 illustrated in FIGS. 6 and 7. Push rod 18, which can be moved up and down in the direction of the arrows, is pretensioned with a compression spring 12 in the holding position. In the open position, as shown here, push rod 18 is pushed down against the force of spring 12.

On the upper end of push rod 18, a hub 24, in which rollers 45 are mounted, is located; these are arranged rotatable on the free end of the second leg 46.

The second leg 46 consists of a rigid section, which is mounted with its radial outside end in the pivot axis 9. A springy section 44 in junction area of the first leg 42 and the second leg 46 is attached to the rigid section, which on its free end leads into 41. A locating face 43 is provided on the lower end of these pegs 41.

Push rod 18 is developed hollow so that particles can be extracted.

Figure 9:
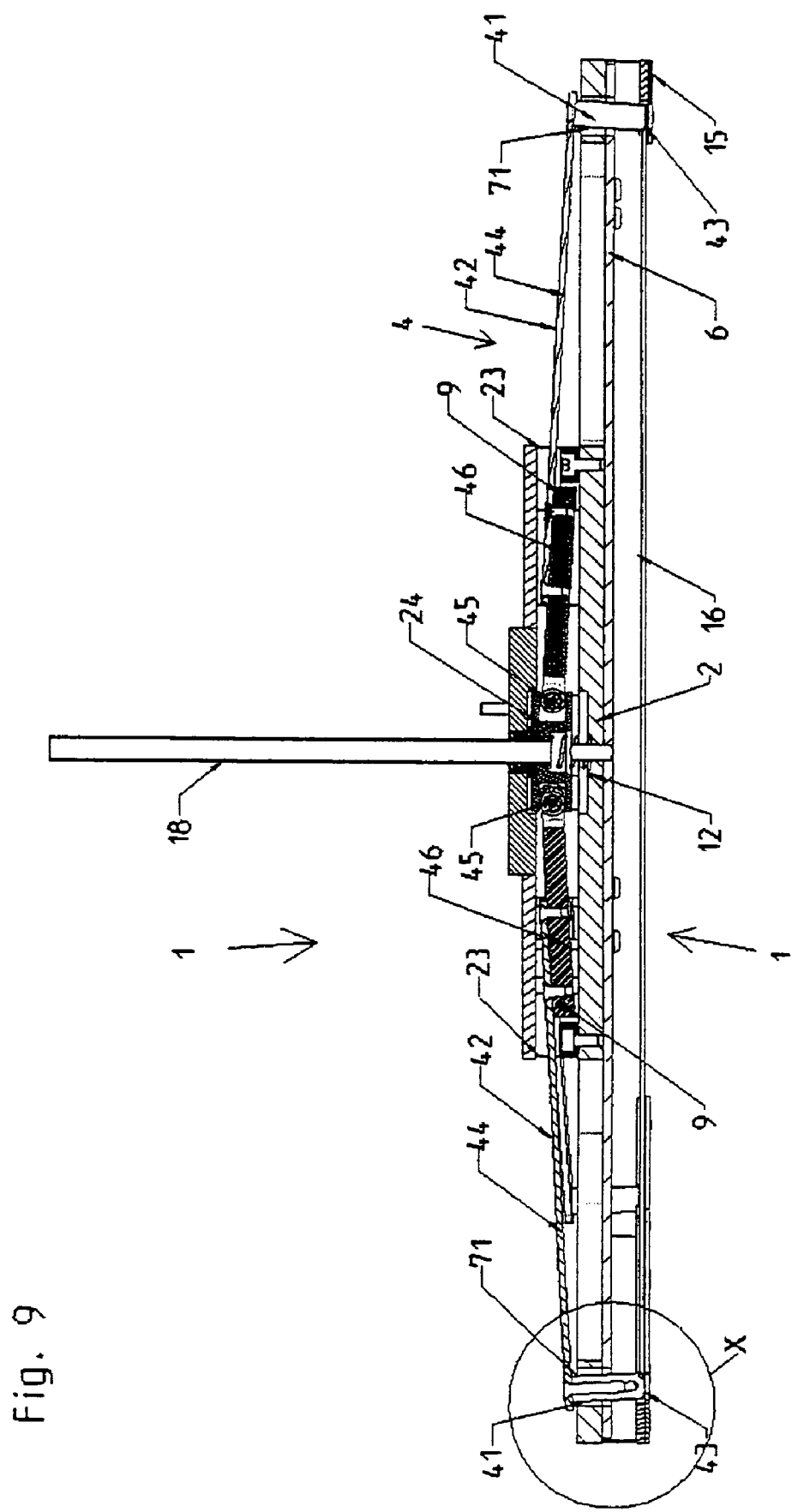
FIG. 9 a vertical section through the holding device presented in FIGS. 6 and 7, in the holding position.
Figure 10:
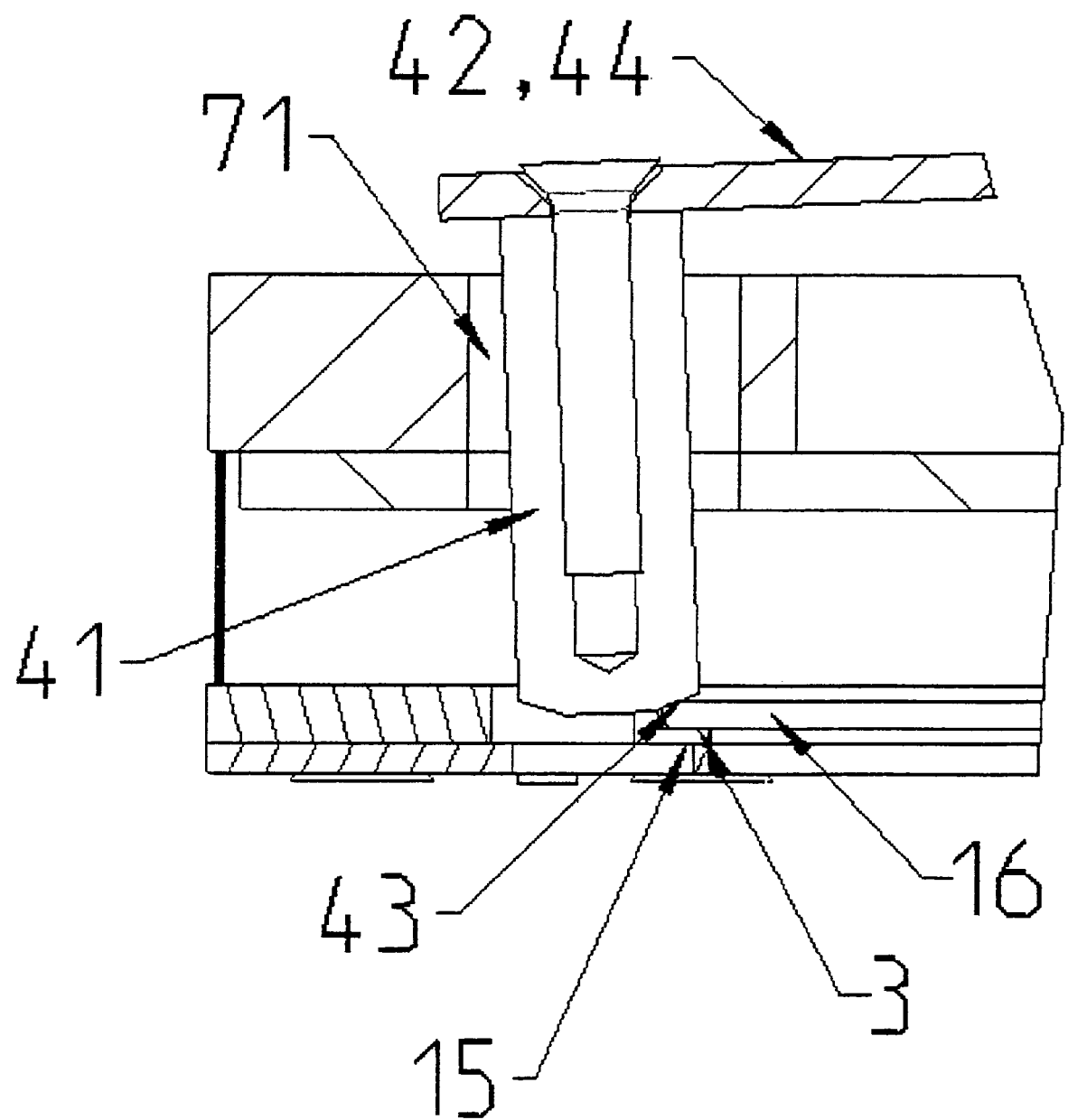
FIG. 10 an enlarged illustration of detail x in FIG. 9.

FIG. 9 shows the holding position of holding device 1. The locating face 43 touches the edge of the wafer 16, shown as detail x, which is enlarged in FIG. 10.

A common feature of all opening mechanism is that they are only connected to push rod 18 in the rest position. When in operation, the opening mechanisms for the push rod are retracted and are thus mechanically disengaged, which has the advantage that they do not have to be rotated.

Figure 11:
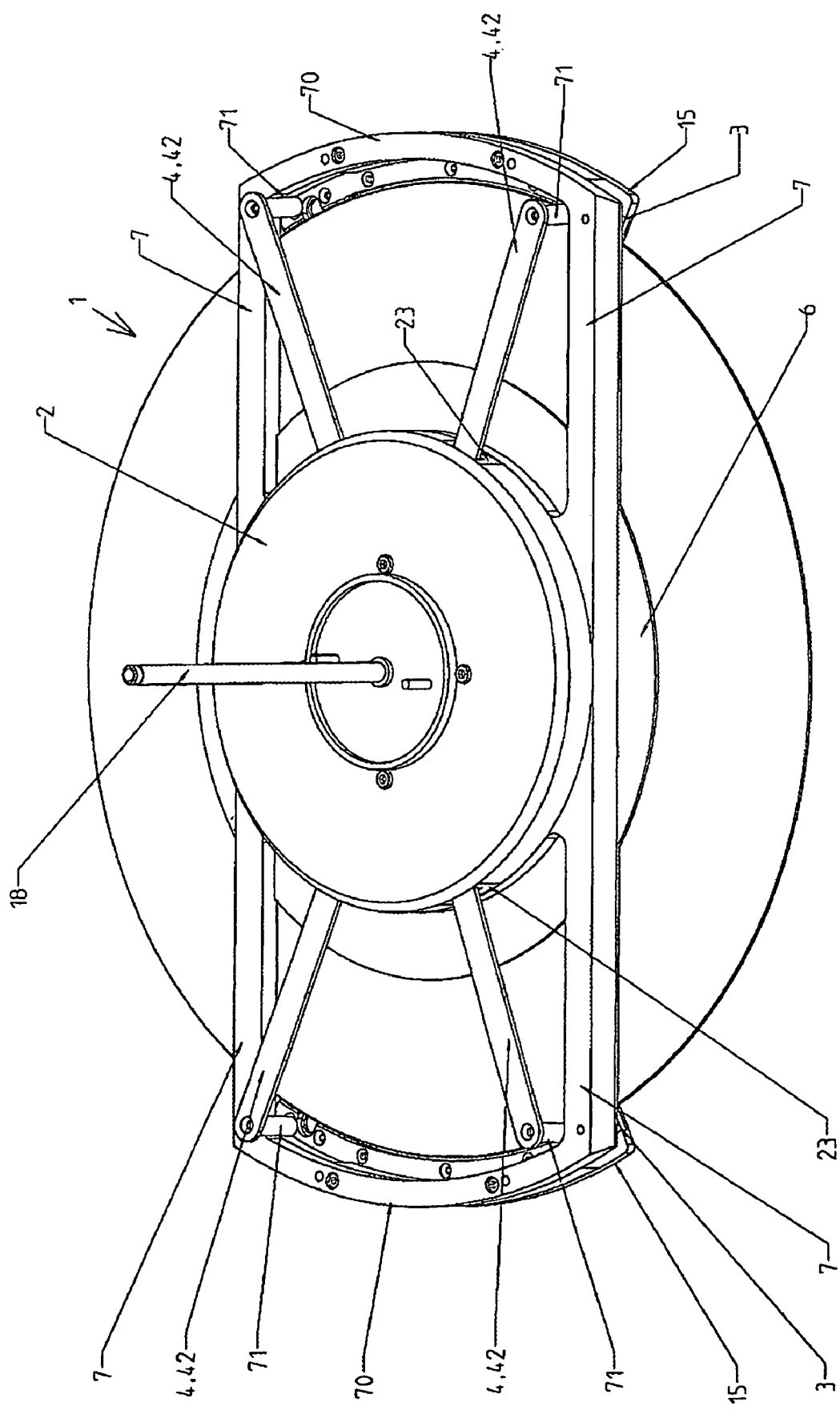
FIG. 11 a holding device according to another embodiment in the overhead position.

In the open condition, wafer 16 passes between pegs 41 and the support elements 15. The wafer is then lowered onto the support elements 15, at which point the wafer is secured in the coarse centering position. Subsequently, the pressure on push rod 18 is removed and the gripper fingers 4 are pushed against the wafer edge by the pretensioned spring 12. The device can now begin rotation. In order to further increase the axial runout of the wafer, the following effect can be utilized. The air between the wafer 16 and the shielding disk 6 gathers additional centrifugal forces during the rotation, and, since in contrast to the back of the wafer, air can not freely flow in, the pressure drops, deflecting the wafer upward. This effect will compensate for wafer sag, because of its weight, if a suitable type and position for shielding disk 6 is selected, as shown in FIG. 11. The holding device 1 shown therein is predominately identical to the holding device shown in FIG. 6, except for the shielding disk 6, the diameter of which is apparently smaller than the diameter of the object.

LIST OF REFERENCE NUMBERS

1 Holding device
2 Central clamping arm fixture
3 Support surface
4 Gripper finger
5 Vacuum feed-thru
6 Shielding disk
7 Clamping arm
8 Housing
9 Pivot axis
10 Connecting element
10*a* Pivot point
10*b* Pivot point
11 Radial piston
12 Compression spring
13 Bush
14 Vacuum feed
15 Support element
16 Wafer
17 Push rod
18 Push rod
19 Linear guide
20 Magnet inductor
21 Magnet coil
22 Body
23 Opening
24 Hub
41 Peg
42 First leg
43 Locating face
44 Springy section
45 Roller
46 Second leg
70 Frame element
71 Opening
100 Opening mechanism

The invention claimed is:

1. A holding device for disk-shaped objects, comprising: a central clamping arm fixture, and at least two centrally mounted and outwardly extending clamping arms, comprising support surfaces adapted for the object and pivotable gripper fingers, in which the gripper fingers are pivotable on a pivot axis from a holding position into an opening position and vice versa, and are pretensioned by means of at least one pretension element and are actuated by means of at least one opening mechanism, wherein the gripper fingers are pivotally mounted in such a manner that they grasp the object only perpendicular in relation to a disk surface in the holding position, wherein an edge of the object is clamped between the gripper fingers and the support surface, and wherein said at least one opening mechanism and at least one pretension element are integrated in the central clamping arm fixture or the clamping arms, or a combination thereof.

2. The holding device as claimed in claim 1, wherein the opening mechanism comprises at least one or a plurality of magnetically operated opening mechanism(s).

3. The holding device as claimed in claim 1, wherein the opening mechanism comprises at least one or a plurality of air-operated opening mechanism(s).

4. The holding device as claimed in claim 1, wherein the opening mechanism comprises at least one or a plurality of vacuum-operated opening mechanism(s).

5. The holding device according to claim 1, wherein the gripper fingers comprise a first leg and a second leg in which a locating face is provided on the first leg for grasping the object.

6. The holding device as claimed in claim 5, wherein the locating face faces away from clamping arm and that the pivot axis is located in a junction area of both legs of the gripper finger.

7. The holding device according to claim 1, wherein the pivot axes are located in or above a plane formed by the support surfaces of different clamping arms so that the gripper fingers grasp the object only perpendicular in relation to the disk surface in the holding position.

8. The holding device according to claim 1, wherein the gripper fingers are developed so that each gripper finger essentially exerts pressure on the object from the top in the holding position.

9. The holding device according to claim 1, wherein the gripper fingers are arranged on the very end of the clamping arms by means of the pivot axes.

10. The holding device according to claim 1, wherein the opening mechanism comprises at least one slidable push rod alongside clamping arm, which is connected with a swivel joint.

11. The holding device as claimed in claim 10, wherein the swivel joint is a connecting element which is hinged to the free end of a second leg of the gripper finger.

12. The holding device according to claim 1, wherein a locating face is faced toward the clamping arm and the pivot axis is arranged in a second leg of the gripper finger.

13. The holding device as claimed in claim 12, wherein the pivot axis is arranged in an area between a center of the leg and inner end of the second leg.

14. The holding device according to claim 12, wherein a section of the second leg between pivot axis and a first leg of the gripper finger is springy.

15. The holding device according to claim 12, wherein the gripper finger has a first leg that is a peg with an inclined locating face.

16. The holding device according to claim 12, wherein the clamping arms are arranged above the object.

17. The holding device according to claim 1, wherein a shielding disk is located between the object and the clamping arm.

18. The holding device according to claim 17, wherein the diameter of the shielding disk is smaller than the object diameter to an extent that in an overhead position, sagging of the object is compensated.

19. The holding device according to claim 1, wherein at least one opening mechanism or at least one pretension element, or a combination thereof is encapsulated in the central clamping arm fixture or in the clamping arms, or combination thereof.

* * * * *